(12) United States Patent
Kim et al.

(10) Patent No.: US 10,679,565 B2
(45) Date of Patent: Jun. 9, 2020

(54) ARRAY SUBSTRATE, DISPLAY PANEL, DISPLAY DEVICE AND DRIVING METHOD

(71) Applicant: BOE TECHNOLOGY GROUP CO., LTD., Beijing (CN)

(72) Inventors: Jiha Kim, Beijing (CN); Seung Woo Han, Beijing (CN); Guangliang Shang, Beijing (CN); Haoliang Zheng, Beijing (CN); Xing Yao, Beijing (CN); Mingfu Han, Beijing (CN); Zhichong Wang, Beijing (CN); Lijun Yuan, Beijing (CN); Yun Sik Im, Beijing (CN); Yinglong Huang, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/063,448

(22) PCT Filed: Nov. 7, 2017

(86) PCT No.: PCT/CN2017/109689
§ 371 (c)(1),
(2) Date: Jun. 18, 2018

(87) PCT Pub. No.: WO2018/196323
PCT Pub. Date: Nov. 1, 2018

(65) Prior Publication Data
US 2019/0279574 A1    Sep. 12, 2019

(30) Foreign Application Priority Data
Apr. 27, 2017  (CN) .......................... 2017 1 0289041

(51) Int. Cl.
*G09G 3/3266* (2016.01)
*G11C 19/28* (2006.01)
(Continued)

(52) U.S. Cl.
CPC ......... *G09G 3/3266* (2013.01); *G09G 3/3208* (2013.01); *G11C 19/287* (2013.01);
(Continued)

(58) Field of Classification Search
CPC ......... G09G 3/3266; G09G 2310/0286; G09G 2300/0426; G09G 2310/08; G09G 2300/0809; G11C 19/287; H01L 27/124
See application file for complete search history.

(56) References Cited

U.S. PATENT DOCUMENTS 9,779,681 B2 * 10/2017 Yu ........................ G02F 1/13306
2005/0174299 A1 * 8/2005 Park ...................... G09G 3/3611
345/1.1
(Continued)

FOREIGN PATENT DOCUMENTS

CN       1773338 A    5/2006
CN       1790139 A    6/2006
(Continued)

OTHER PUBLICATIONS

International Search Report dated Jan. 29, 2018.
First Chinese Office Action dated Sep. 11, 2018.

*Primary Examiner* — Vinh T Lam
(74) *Attorney, Agent, or Firm* — Dilworth & Barrese, LLP.; Michael J. Musella, Esq.

(57) ABSTRACT

An array substrate, a display panel, a display device and a driving method. The array substrate includes: a plurality of first pixel units arranged in an array in a first region; a first gate driving circuit a second gate driving circuit; a plurality of first gate lines connected with the first gate driving circuit; and a plurality of second gate lines connected with the second gate driving circuit. A first portion of the plurality of first pixel units is connected with the plurality of first gate lines, and each first pixel unit in the first portion is connected with one of the plurality of first gate lines; and a second
(Continued)

portion of the plurality of first pixel units is connected with the plurality of second gate lines, and each first pixel unit in the second portion is connected with one of the plurality of second gate lines.

15 Claims, 11 Drawing Sheets

(51) Int. Cl.
    *H01L 27/12*     (2006.01)
    *G09G 3/3208*     (2016.01)

(52) U.S. Cl.
    CPC ... *H01L 27/124* (2013.01); *G09G 2300/0426* (2013.01); *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 2006/0097981 A1 | 5/2006 | Park | |
| 2008/0123026 A1* | 5/2008 | Kwag | G02F 1/133555 349/77 |
| 2008/0198283 A1 | 8/2008 | Yoon | |
| 2009/0027425 A1 | 1/2009 | Park | |
| 2010/0066655 A1 | 3/2010 | Uh | |
| 2013/0093657 A1* | 4/2013 | Song | G09G 3/3648 345/92 |
| 2013/0201175 A1 | 8/2013 | Liu | |
| 2014/0077725 A1* | 3/2014 | Lee | H05B 37/02 315/312 |
| 2014/0209932 A1* | 7/2014 | Huang | H01L 27/124 257/88 |
| 2014/0326996 A1* | 11/2014 | Yamazaki | G02F 1/136227 257/43 |
| 2015/0070616 A1* | 3/2015 | Ogasawara | G02F 1/1339 349/43 |
| 2015/0161960 A1* | 6/2015 | Park | G09G 3/3611 345/99 |
| 2015/0331518 A1* | 11/2015 | Kaneko | G06F 3/0412 345/174 |
| 2016/0055800 A1 | 2/2016 | Song et al. | |
| 2016/0275849 A1* | 9/2016 | Tsai | G09G 3/3677 |
| 2016/0370635 A1* | 12/2016 | Tanaka | G02F 1/1368 |
| 2016/0379585 A1 | 12/2016 | Yao et al. | |
| 2017/0220149 A1 | 8/2017 | Jin | |
| 2017/0287390 A1* | 10/2017 | Lee | G09G 3/3233 |

FOREIGN PATENT DOCUMENTS

| | | |
|---|---|---|
| CN | 101251692 A | 8/2008 |
| CN | 102707524 A | 10/2012 |
| CN | 103913915 A | 7/2014 |
| CN | 104318885 A | 1/2015 |
| CN | 104599627 A | 5/2015 |
| CN | 104795044 A | 7/2015 |
| CN | 105549247 A | 5/2016 |
| CN | 205581456 U | 9/2016 |
| CN | 106098010 A | 11/2016 |
| CN | 106504705 A | 3/2017 |
| CN | 106548745 A | 3/2017 |
| CN | 106875890 A | 6/2017 |

* cited by examiner

ARRAY SUBSTRATE, DISPLAY PANEL, DISPLAY DEVICE AND DRIVING METHOD

TECHNICAL FIELD

Embodiments of the present disclosure relate to an array substrate, a display panel, a display device and a driving method.

BACKGROUND

In a display technology field, Organic Light-Emitting Diode (OLED) display panels have a broad prospect for development due to characteristics such as self-luminescence, high contrast, low energy consumption, a wide viewing angle, a fast response speed, applicability to a flexible panel, a wide range of applicable temperatures, simple fabrication and so on. Due to the above-described characteristics, an OLED display panel may be applied to a mobile phone, a display, a notebook computer, a digital camera, an instrument and a meter, and other devices having a display function.

With rapid development of the display technology, display panels are increasingly developed toward a trend of high integration and low cost. In a Gate-Driver on Array (GOA) technology, a gate driving circuit is directly integrated onto an array substrate of a display device by using a photolithography process; a GOA circuit usually includes a plurality of cascaded shift registers, each shift register corresponds to a gate line (for example, each shift register provides a scan driving signal to a gate line corresponding to a row or a column of pixels), so as to implement scan driving of the display panel. This integration technology may save space of a bonding region and a fan-out region of a gate Integrated Circuit (IC), so as to implement a narrow frame of the display panel, and meanwhile reduce a product cost and increase a product yield rate.

SUMMARY

Embodiments of the disclosure provide an array substrate, comprising: a plurality of first pixel units arranged in an array in a first region; a first gate driving circuit; a second gate driving circuit; a plurality of first gate lines connected with the first gate driving circuit; and a plurality of second gate lines connected with the second gate driving circuit, wherein: a first portion of the plurality of first pixel units is connected with the plurality of first gate lines, and each first pixel unit in the first portion is connected with one of the plurality of first gate lines; and a second portion of the plurality of first pixel units is connected with the plurality of second gate lines, and each first pixel unit in the second portion is connected with one of the plurality of second gate lines.

For example, the array substrate provided by the embodiments of the disclosure further comprises: a plurality of second pixel units arranged in an array in a second region; a plurality of third pixel units arranged in an array in a third region; a plurality of third gate lines connected with the first gate driving circuit; and a plurality of fourth gate lines connected with the second gate driving circuit, wherein: a first portion of the plurality of second pixel units is connected with the plurality of first gate lines, and each second pixel unit in the first portion is connected with one of the plurality of first gate lines; a second portion of the plurality of second pixel units is connected with the plurality of third gate lines, and each second pixel unit in the second portion is connected with one of the plurality of third gate lines; a first portion of the plurality of third pixel units is connected with the plurality of second gate lines, and each third pixel unit in the first portion is connected with one of the plurality of second gate lines; and a second portion of the plurality of third pixel units is connected with the plurality of fourth gate lines, and each third pixel unit in the second portion is connected with one of the plurality of fourth gate lines.

For example, in the array substrate provided by embodiments of the disclosure, first pixel units in a (2n−1)th row and second pixel units in the (2n−1)th row are connected with an nth first gate line; first pixel units in a 2nth row and third pixel units in the 2nth row are connected with an nth second gate line; second pixel units in the 2nth row are connected with an nth third gate line; third pixel units in the (2n−1)th row are connected with an nth fourth gate line; and n is an integer greater than 0, $n \leq N/2$, and N is a total number of rows of pixel units in respective regions.

For example, in the array substrate provided by embodiments of the disclosure, the first region is provided between the second region and the third region.

For example, in the array substrate provided by embodiments of the disclosure, the first gate driving circuit and the second gate driving circuit are provided on opposite sides of the array substrate.

For example, in the array substrate provided by embodiments of the disclosure, the first gate driving circuit includes a first shift register group, and the first shift register group includes a plurality of cascaded first shift registers; except for a first stage and a last stage, an input terminal of a first shift register of a present stage is connected with an output terminal of a first shift register of a previous stage; the second gate driving circuit includes a second shift register group, and the second shift register group includes a plurality of cascaded second shift registers; except for a first stage and a last stage, an input terminal of a second shift register of a present stage is connected with an output terminal of a second shift register of a previous stage; the first gate driving circuit further includes a third shift register group, and the third shift register group includes a plurality of cascaded third shift registers; except for a first stage and a last stage, an input terminal of a third shift register of a present stage is connected with an output terminal of a third shift register of a previous stage; and the second gate driving circuit further includes a fourth shift register group, and the fourth shift register group includes a plurality of cascaded first shift registers; except for a first stage and a last stage, an input terminal of a fourth shift register of a present stage is connected with an output terminal of a fourth shift register of a previous stage.

For example, in the array substrate provided by embodiments of the disclosure, an output terminal of each respective first shift register is correspondingly connected with one of the first gate lines, and the respective first shift register is configured to output a first gate driving signal to the one of the first gate lines in response to a first clock signal; an output terminal of each respective second shift register is correspondingly connected with one of the second gate lines, and the respective second shift register is configured to output a second gate driving signal to the one of the second gate lines in response to a second clock signal; an output terminal of each respective third shift register is correspondingly connected with one of the third gate lines, and the respective third shift register is configured to output a third gate driving signal to the one of the third gate lines in response to a third clock signal; and an output terminal of each respective fourth shift register is correspondingly connected with one of the fourth gate line, and the respective fourth shift register is configured to output a fourth gate driving signal to the one of the fourth gate lines in response to a fourth clock signal.

For example, the array substrate provided by the embodiments of the disclosure further comprises a first clock generator and a second clock generator, wherein: the first clock generator is configured to provide the first clock signal to the first shift registers; the second clock generator is configured to provide the second clock signal to the second shift registers; the first clock generator is further configured to provide the third clock signal to the third shift registers; and the second clock generator is further configured to provide the fourth clock signal to the fourth shift registers.

For example, the array substrate provided by the embodiments of the disclosure further comprises a clock controller, respectively connected with the first clock generator and the second clock generator, configured to control a time sequence of the first clock signal and a time sequence of the third clock signal provided by the first clock generator, and to control a time sequence of the second clock signal and a time sequence of the fourth clock signal provided by the second clock generator.

For example, the array substrate provided by the embodiments of the disclosure further comprises three display bands, wherein each of the display bands includes the first region, the second region and the third region, and in each same display band, a quantity of rows of first pixel units in the first region, a quantity of rows of second pixel units in the second region, and a quantity of rows of third pixel units in the third region are equal.

For example, in the array substrate provided by embodiments of the disclosure, each of the first shift register, the second shift register, the third shift register and the fourth shift register includes: an input circuit, respectively connected with an input terminal and a pull-up node; a reset circuit, respectively connected with the pull-up node, a reset terminal, and a first power supply terminal; an output circuit, respectively connected with the pull-up node, a clock signal terminal and an output terminal; an output terminal pull-down circuit, respectively connected with the output terminal, a pull-down node and the first power supply terminal; a pull-down node control circuit, respectively connected with the pull-down node, a second power supply terminal, and the first power supply terminal; and a storage capacitor, respectively connected with the pull-up node and the output terminal.

For example, in the array substrate provided by embodiments of the disclosure, the input circuit includes a first transistor, a first electrode of the first transistor is connected with the input terminal, a gate electrode of the first transistor is connected with the input terminal, and a second electrode of the first transistor is connected with the pull-up node; the reset circuit includes a second transistor, a first electrode of the second transistor is connected with the pull-up node, a gate electrode of the second transistor is connected with the reset terminal, and a second electrode of the second transistor is connected with the first power supply terminal; the output circuit includes a third transistor, a first electrode of the third transistor is connected with the clock signal terminal, a gate electrode of the third transistor is connected with the pull-up node, and a second electrode of the third transistor is connected with the output terminal; the output terminal pull-down circuit includes a fourth transistor, a first electrode of the fourth transistor is connected with the output terminal, a gate electrode of the fourth transistor is connected with the pull-down node, and a second electrode of the fourth transistor is connected with the first power supply terminal; the pull-down node control circuit includes a fifth transistor and a sixth transistor, a first electrode of the fifth transistor is connected with the second power supply terminal, a gate electrode of the fifth transistor is connected with the second power supply terminal, and a second electrode of the fifth transistor is connected with the pull-down node, a first electrode of the sixth transistor is connected with the pull-down node, a gate electrode of the sixth transistor is connected with the pull-up node, and a second electrode of the sixth transistor is connected with the first power supply terminal; and a first terminal of the storage capacitor is connected with the pull-up node, and a second terminal of the storage capacitor is connected with the output terminal.

Embodiments of the disclosure further provide a display panel, comprising the array substrate described above.

Embodiments of the disclosure further provide a display device, comprising the display panel described above.

Embodiments of the disclosure further provide a method for driving the array substrate described above, comprising: providing a first gate driving signal to a first portion of first pixel units through a first gate driving circuit; and providing a second gate driving signal to a second portion of the first pixel units through a second gate driving circuit, wherein: when a first region is in a high resolution mode, a time sequence of the first gate driving signal is different from a time sequence of the second gate driving signal; and when the first region is in a low resolution mode, the time sequence of the first gate driving signal is the same as the time sequence of the second gate driving signal.

BRIEF DESCRIPTION OF THE DRAWINGS

In order to illustrate the technical solutions in the embodiments of the present disclosure more clearly, the drawings used in the description of the embodiments will be briefly described in the following; it is obvious that the drawings described below are only related to some embodiments of the present disclosure, and not intended to be limitative to the disclosure.

DETAILED DESCRIPTION

Figure 1:
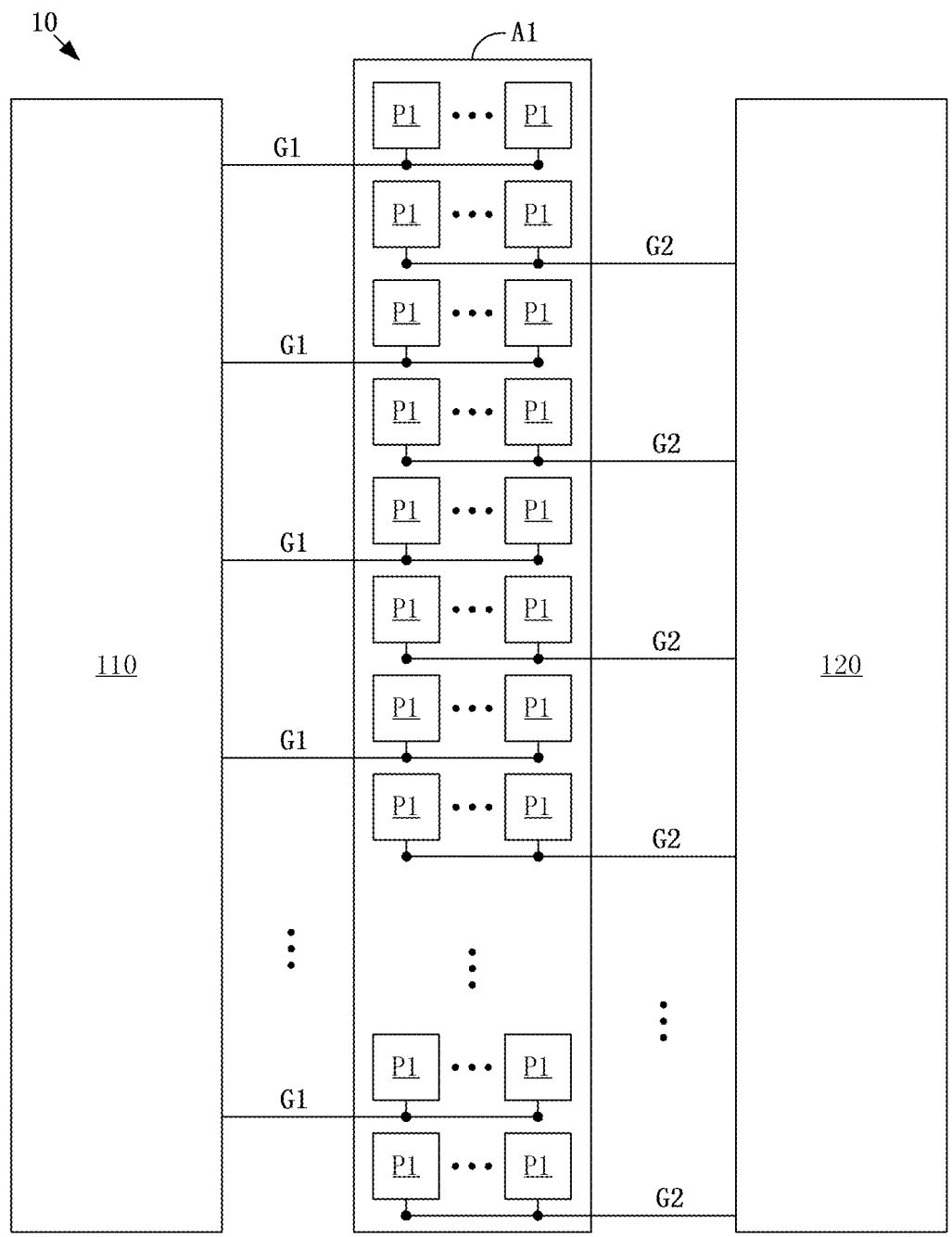
FIG. 1 is a first schematic diagram of an array substrate provided by an embodiment of the present disclosure.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies are not described in the present disclosure so as not to obscure the exemplary embodiments of the present disclosure. Examples given are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. In addition, in respective embodiments of the present disclosure, same or similar reference signs denote same or similar parts.

A display panel to which a conventional gate driving circuit is applied has a fixed resolution, cannot have the resolution adjusted according to actual needs, and cannot implement selective driving in different regions of the display panel. A display panel, a display device and a driving method provided by embodiments of the present disclosure may change a display resolution and may perform selective driving with different resolutions in different regions of the display panel.

For example, an embodiment of the present disclosure provides an array substrate 10. As shown in FIG. 1, the array substrate 10 comprises: a plurality of first pixel units P1 arranged in an array in a first region A1; a first gate driving circuit 110; a second gate driving circuit 120; a plurality of first gate lines G1 connected with the first gate driving circuit 110; and a plurality of second gate lines G2 connected with the second gate driving circuit 120. A first portion of the plurality of first pixel units P1 is connected with the plurality of first gate lines G1, and each first pixel unit P1 in the first portion is connected with one of the plurality of first gate lines G1; a second portion of the plurality of first pixel units P1 is connected with the plurality of second gate lines G2, and each first pixel unit P1 in the second portion is connected with one of the plurality of second gate lines G2. For example, the plurality of first pixel units P1 include a first subset and a second subset, wherein the first subset includes first pixel units P1 in the first portion of the plurality of first pixel units P1, and the second subset includes first pixel units P1 in the second portion of the plurality of first pixel units P1.

For example, with further reference to FIG. 1, in the array substrate 10 provided by an embodiment of the present disclosure, the first pixel units P1 in a (2n−1)th row are connected with one of the first gate lines G1; the first pixel units P1 in a 2nth row are connected with one of the second gate lines G2, where n is an integer greater than 0, a maximum value n(max) of n satisfies 2*n(max)=N, and therefore, n≤N/2, and N is a total number of gate lines in the first region A1.

For another example, the first pixel units P1 in the (2n−1)th row are connected with an nth first gate line G1, and the first pixel units P1 in the 2nth row are connected with an nth second gate line G2.

It should be noted that, the embodiments of the present disclosure include, but are not limited to, a case where the first pixel units P1 in the (2n−1)th row are connected with one of the first gate lines G1, and the first pixel units P1 in the 2nth row are connected with one of the second gate lines G2. It is also possible that the first pixel units P1 in the (2n−1)th row are connected with one of the second gate lines G2, and the first pixel units P1 in the 2nth row are connected with one of the first gate lines G1.

For example, first pixel units P1 in a same column share a same data line (not shown). That is to say, the first pixel units in the same column are connected with the same data line. In a low resolution mode, a time sequence of a first gate driving signal provided by the first gate driving circuit 110 through the first gate line G1 is the same as a time sequence of a second gate driving signal provided by the second gate driving circuit 120 through the second gate line G2; and a first pixel unit P1 in the (2n−1)th row and a first pixel units P1 in the 2nth row that are in a same column will be simultaneously turned on in response to the first gate driving signal and the second gate driving signal respectively, to receive a same data signal. In this case, the first pixel unit P1 in the (2n−1)th row and the first pixel unit P1 in the 2nth row display a same image, so as to reduce a display resolution of the array substrate. In a high resolution mode, the time sequence of the first gate driving signal provided by the first gate driving circuit 110 through the first gate line G1 is different from the time sequence of the second gate driving signal provided by the second gate driving circuit 120 through the second gate line G2; and the first pixel units P1 in the same column will be turned on in response to a sequence of the first gate driving signal and the second gate driving signal, respectively, to perform progressive scanning. In this case, the first pixel units P1 in the (2n−1)th row and in the 2nth row display different images, so as to maintain the display resolution of the array substrate.

For example, an expression that time sequences of gate driving signals are the same refers to that gate driving signals provided by corresponding gate lines are the same; for example, the first gate driving signal provided by the first gate line connected with the first pixel units P1 in the (2n−1)th row is the same as the second gate driving signal provided by the second gate line connected with the first pixel units P1 in the 2nth row.

For example, the low resolution mode is an FHD (2K pixels) mode, and the high resolution mode is a UD (4K pixels) mode.

Figure 2:
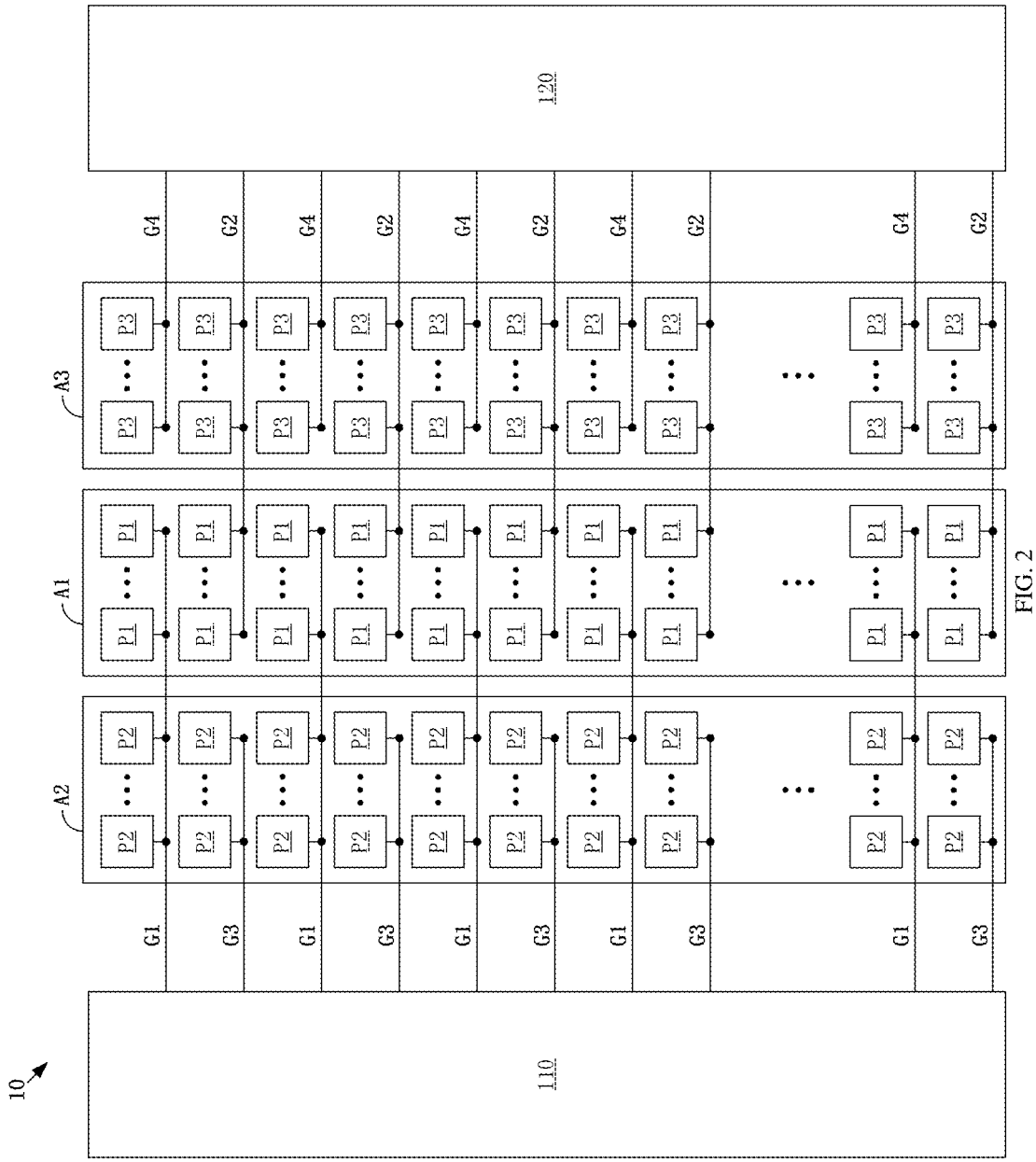
FIG. 2 is a second schematic diagram of an array substrate provided by an embodiment of the present disclosure.

For example, as shown in FIG. 2, the array substrate 10 provided by embodiments of the present disclosure further comprises: a plurality of second pixel units P2 arranged in an array in a second region A2; a plurality of third pixel units P3 arranged in an array in a third region A3; a plurality of third gate lines G3 connected with the first gate driving circuit 110; and a plurality of fourth gate lines G4 connected with the second gate driving circuit 120. A first portion of the plurality of second pixel units P2 is connected with the plurality of first gate lines G1, and each second pixel unit P2 in the first portion is connected with one of the plurality of first gate lines G1; a second portion of the plurality of second pixel units P2 is connected with the plurality of third gate lines G3, and each second pixel unit P2 in the second portion is connected with one of the plurality of third gate lines G3; a first portion of the plurality of third pixel units P3 is connected with the plurality of second gate lines G2, and each third pixel unit P3 in the first portion is connected with one of the plurality of second gate lines G2; a second portion of the plurality of third pixel units P3 is connected with the plurality of fourth gate lines G4, and each third pixel unit P3 in the second portion is connected with one of the plurality of fourth gate lines G4.

For example, the plurality of second pixel units P2 include a first subset and a second subset, wherein the first subset includes second pixel units P2 in the first portion of the plurality of second pixel units P2, and the second subset includes second pixel units P2 in the second portion of the plurality of second pixel units P2. The plurality of third pixel units P3 include a first subset and a second subset, wherein the first subset includes third pixel units P3 in the first portion of the plurality of third pixel units P3, and the second subset includes third pixel units P3 in the second portion of the plurality of third pixel units P3.

For example, with further reference to FIG. 2, in the array substrate 10 provided by embodiments of the present disclosure, the first pixel units P1 in the (2n−1)th row and the second pixel units P2 in the (2n−1)th row are connected with one of the first gate lines G1; the first pixel units P1 in the 2nth row and the third pixel units P3 in the 2nth row are connected with one of the second gate lines G2; the second pixel units P2 in the 2nth row are connected with one of the third gate lines G3; the third pixel units P3 in the (2n−1)th row are connected with one of the fourth gate lines G4; where n is an integer greater than 0, n≤N/2, and N is the total number of rows of pixel units in respective regions or the total number of gate lines in respective regions.

For another example, the first pixel units P1 in the (2n−1)th row and the second pixel units P2 in the (2n−1)th row are connected with the nth first gate line G1; the first pixel units P1 in the 2nth row and the third pixel units P3 in the 2nth row are connected with the nth second gate line G2; the second pixel units P2 in the 2nth row are connected with an nth third gate line G3; and the third pixel units P3 in the (2n−1)th row are connected with an nth fourth gate line G4; and n is an integer greater than 0. For example, when n=1, first pixel units P1 in a 1st row and second pixel units P2 in the 1st row are connected with a 1st first gate line G1; first pixel units P1 in a 2nd row and third pixel units P3 in the 2nd row are connected with a 1st second gate line G2; second pixel units P2 in the 2nd row are connected with a 1st third gate line G3; and third pixel units P3 in the 1st row are connected with a 1st fourth gate line G4. For another example, when n=2, first pixel units P1 in a 3rd row and second pixel units P2 in the 3rd row are connected with a 2nd first gate line G1; first pixel units P1 in a 4th row and third pixel units P3 in the 4th row are connected with a 2nd second gate line G2; second pixel units P2 in a 4th row are connected with a 2nd third gate line G3; and third pixel units P3 in the 3rd row are connected with a 2nd fourth gate line G4. For example, when n is another integer greater than 0, similar connections may be inferred to in this way, which will not be repeated here.

For example, when the first region A1 is in the low resolution mode, the time sequence of the first gate driving signal output by the first gate driving circuit 110 through the first gate line G1 is the same as the time sequence of the second gate driving signal output by the second gate driving circuit 120 through the second gate line G2; when the first region A1 is in the high resolution mode, the time sequence of the first gate driving signal output by the first gate driving circuit 110 through the first gate line G1 is different from the time sequence of the second gate driving signal output by the second gate driving circuit 120 through the second gate line G2.

For example, when the second region A2 is in the low resolution mode, the time sequence of the first gate driving signal output by the first gate driving circuit 110 through the first gate line G1 is the same as a time sequence of a third gate driving signal output by the first gate driving circuit 110 through the third gate line G3; when the second region A2 is in the high resolution mode, the time sequence of the first gate driving signal output by the first gate driving circuit 110 through the first gate line G1 is different from the time sequence of the third gate driving signal output by the first gate driving circuit 110 through the third gate line G3.

For example, when the third region A3 is in the low resolution mode, the time sequence of the second gate driving signal output by the second gate driving circuit 120 through the second gate line G2 is the same as a time sequence of a fourth gate driving signal output by the second gate driving circuit 120 through the fourth gate line G4; when the third region A3 is in the high resolution mode, the time sequence of the second gate driving signal output by the second gate driving circuit 120 through the second gate line G2 is different from the time sequence of the fourth gate driving signal output by the second gate driving circuit 120 through the fourth gate line G4.

For example, by adjusting a relationship among the time sequence of the first gate driving signal, the time sequence of the second gate driving signal, the time sequence of the third gate driving signal and the time sequence of the fourth gate driving signal, a display resolution may be changed, and selective driving with different resolutions may be performed in different regions of the array substrate (e.g., the first region A1, the second region A2 and the third region A3), so that it is possible to implement displaying with different resolutions in different regions, thereby reducing power consumption while ensuring a user's viewing experience.

For example, when the user views the first region A1, the first region A1 is in the high resolution mode, and the second region A1 and the third region A3 are in the low resolution mode.

For example, with further reference to FIG. 2, in the array substrate 10 provided by embodiments of the present disclosure, the first region A1 is provided between the second region A2 and the third region A3.

For example, the embodiments of the present disclosure include, but are not limited to, a case where the array substrate 10 comprises the first region A1, the second region A2 and the third region A3. The array substrate 10 may further comprise a larger number of regions.

For example, in the array substrate 10 provided by embodiments of the present disclosure, the first gate driving circuit 110 and the second gate driving circuit 120 are provided on opposite sides of the array substrate 10. For example, the first gate driving circuit 110 and the second gate driving circuit 120 are provided on opposite sides of the array substrate 10, which may facilitate circuit design and production and reduce costs.

Figure 3:
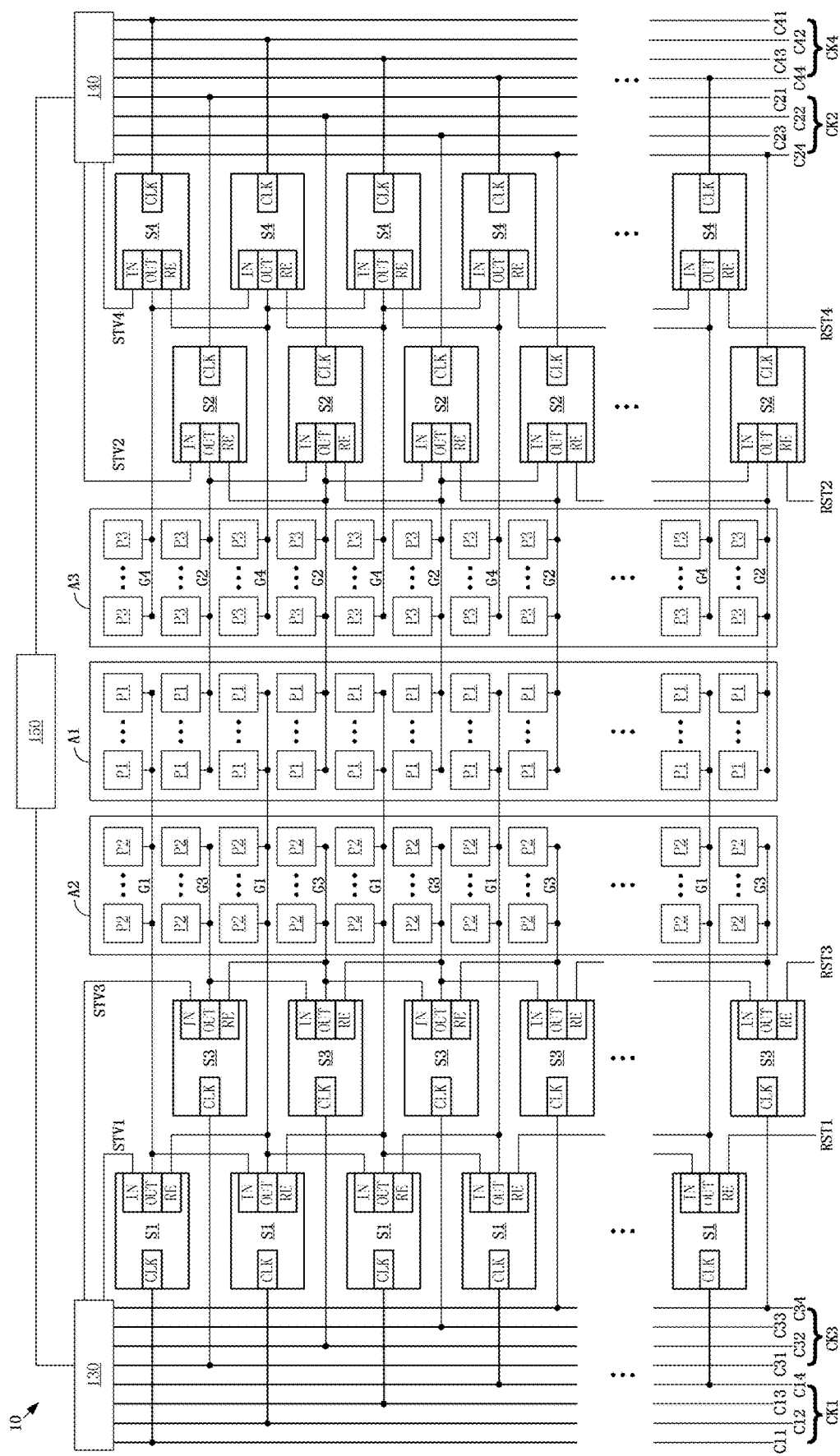
FIG. 3 is a third schematic diagram of an array substrate provided by an embodiment of the present disclosure.

For example, as shown in FIG. 3, in the array substrate 10 provided by embodiments of the present disclosure, the first gate driving circuit 110 includes a first shift register group, and the first shift register group includes a plurality of cascaded first shift registers S1. Except for a first stage and a last stage, an input terminal IN of a first shift register S1 of a present stage is connected with an output terminal OUT of a first shift register S1 of a previous stage. The second gate driving circuit 120 includes a second shift register group, and the second shift register group includes a plurality of cascaded second shift registers S2; except for a first stage and a last stage, an input terminal IN of a second shift register S2 of a present stage is connected with an output terminal OUT of a second shift register S2 of a previous stage.

The first gate driving circuit 110 further includes a third shift register group, and the third shift register group includes a plurality of cascaded third shift registers S3. Except for a first stage and a last stage, an input terminal IN of a third shift register S3 of a present stage is connected with an output terminal OUT of a third shift register S3 of a previous stage. The second gate driving circuit 120 further includes a fourth shift register group, and the fourth shift register group includes a plurality of cascaded first shift registers S4. Except for a first stage and a last stage, an input terminal IN of a fourth shift register S4 of a present stage is connected with an output terminal OUT of a fourth shift register S4 of a previous stage.

For example, as shown in FIG. 3, except for the first stage and the last stage, a reset terminal RE of a first shift register S1 of a present stage is connected with an output terminal OUT of a first shift register S1 of a next stage. Except for the first stage and the last stage, a reset terminal RE of a second shift register S2 of a present stage is connected with an output terminal OUT of a second shift register S2 of next stage. Except for the first stage and the last stage, a reset terminal RE of a third shift register S3 of a present stage is connected with an output terminal OUT of a third shift register S3 of a next stage. Except for the first stage and the last stage, a reset terminal RE of a fourth shift register S4 of a present stage is connected with an output terminal OUT of a fourth shift register S4 of a next stage.

For example, as shown in FIG. 3, the input terminal IN of the first shift register S1 of the first stage is configured to receive a first trigger signal STV1. The reset terminal RE of the first shift register S1 of the last stage is configured to receive a first reset signal RST1. The input terminal IN of the second shift register S2 of the first stage is configured to receive a second trigger signal STV2. The reset terminal RE of the second shift register S2 of the last stage is configured to receive a second reset signal RST2. The input terminal IN of the third shift register S3 of the first stage is configured to receive a third trigger signal STV3. The reset terminal RE of the third shift register S3 of the last stage is configured to receive a third reset signal RST3. The input terminal IN of the fourth shift register of the first stage S4 is configured to receive a fourth trigger signal STV4. The reset terminal RE of the fourth shift register S4 of the last stage is configured to receive a fourth reset signal RST4.

For example, as shown in FIG. 3, in the array substrate 10 provided by embodiments of the present disclosure, an output terminal OUT of each respective first shift register S1 is correspondingly connected with one of the first gate lines G1, and each respective first shift register S1 is configured to output a first gate driving signal to one of the first gate lines G1 in response to a first clock signal CK1. An output terminal OUT of each respective second shift register S2 is correspondingly connected with one of the second gate lines G2, and the respective second shift register S2 is configured to output a second gate driving signal to one of the second gate lines G2 in response to a second clock signal CK2. An output terminal OUT of each respective third shift register S3 is correspondingly connected with one of the third gate lines G3, and the respective third shift register S3 is configured to output a third gate driving signal to one of the third gate lines G3 in response to a third clock signal CK3. An output terminal OUT of each respective fourth shift register S4 is correspondingly connected with one of the fourth gate lines G4, and the respective fourth shift register S4 is configured to output a fourth gate driving signal to one of the fourth gate lines G4 in response to a fourth clock signal CK4.

For example, as shown in FIG. 3, the first clock signal CK1 includes signals C11, C12, C13 and C14 that are sequentially arranged in a time sequence and are output through different clock signal lines. The second clock signal CK2 includes signals C21, C22, C23 and C24 that are sequentially arranged in a time sequence and are output through different clock signal lines. The third clock signal CK3 includes signals C31, C32, C33 and C34 that are sequentially arranged in a time sequence and are output through different clock signal lines. The fourth clock signal CK4 includes signals C41, C42, C43 and C44 that are sequentially arranged in a time sequence and are output through different clock signal lines.

For example, an expression that time sequences of the clock signals are the same refers to that all individual signals that are sequentially arranged and included in the respective clock signals are correspondingly the same. For example, an expression that a time sequence of the first clock signal CK1 is the same as a time sequence of the second clock signal CK2 refers to that: a time sequence of the signal C11 is the same as a time sequence of the signal C21, a time sequence of the signal C12 is the same as a time sequence of the signal C22, a time sequence of the signal C13 is the same as a time sequence of the signal C23, and a time sequence of the signal C14 is the same as a time sequence of the signal C24.

For example, an expression that time sequences of two signals are the same refers to that for each particular same time, the two signals have a same voltage.

For example, as shown in FIG. 3, the array substrate 10 provided by embodiments of the present disclosure further comprises a first clock generator 130 and a second clock generator 140. The first clock generator 130 is configured to provide the first clock signal CK1 to the first shift registers S1 (for example, to a clock signal terminal CLK of each first shift register S1); the second clock generator 140 is configured to provide the second clock signal CK2 to the second shift registers S2 (e.g., to a clock signal terminal CLK of each second shift register S2); the first clock generator 130 is further configured to provide the third clock signal CK3 to the third shift registers S3 (e.g., to a clock signal terminal CLK of each third shift register S3); and the second clock generator 140 is further configured to provide the fourth clock signal CK4 to the fourth shift registers S4 (for example, to a clock signal terminal CLK of each fourth shift register S4).

For example, the first clock generator 130 and the second clock generator 140 may further be configured to respectively or jointly provide the first trigger signal STV1, the first reset signal RST1, the second trigger signal STV2, the second reset signal RST2, the third trigger signal STV3, the third reset signal RST3, the fourth trigger signal STV4, the fourth reset signal RST4, and the like.

For example, as shown in FIG. 3, the first clock generator 130 is configured to provide the first clock signal CK1 to first shift registers S1 of respective stages through four clock signal lines. A first shift register S1 of a (4m−3)th stage is configured to receive the signal C11 in the first clock signal CK1; a first shift register S1 of a (4m−2)th stage is configured to receive the signal C12 in the first clock signal CK1; a first shift register S1 of a (4m−1)th stage is configured to receive the signal C13 in the first clock signal CK1; a first shift register S1 of a 4mth stage is configured to receive the signal C14 in the first clock signal CK1, where m is an integer greater than 0. For example, the total number of gate lines in respective regions (for example, A1) is N, and a maximum value m(max) of m satisfied 8*m(max)=N, and therefore, m≤N/8.

For example, as shown in FIG. 3, the second clock generator 140 is configured to provide the second clock signal CK2 to second shift registers S2 of respective stages through four clock signal lines. A second shift register S2 of the (4m−3)th stage is configured to receive the signal C21 in the second clock signal CK2; a second shift register S2 of the (4m−2)th stage is configured to receive the signal C22 in the second clock signal CK2; a second shift register S2 of the (4m−1)th stage is configured to receive the signal C23 in the second clock signal CK2; a second shift register S2 of the 4mth stage is configured to receive the signal C24 in the second clock signal CK1, where m is an integer greater than 0, m≤N/8.

For example, as shown in FIG. 3, the first clock generator 130 is further configured to provide the third clock signal CK3 to third shift registers S3 of respective stages through four clock signal lines. A third shift register S3 of the (4m−3)th stage is configured to receive the signal C31 in the third clock signal CK3; a third shift register S3 of the (4m−2)th stage is configured to receive the signal C32 in the third clock signal CK3; a third shift register S3 of the (4m−1)th stage is configured to receive the signal C33 in the third clock signal CK3; a third shift register S3 of the 4mth stage is configured to receive the signal C34 in the third clock signal CK3, where m is an integer greater than 0, m≤N/8.

For example, as shown in FIG. 3, the second clock generator 140 is further configured to provide the fourth clock signal CK4 to fourth shift registers S4 of respective stages through four clock signal lines. A fourth shift register S4 of the (4m−3)th stage is configured to receive the signal C41 in the fourth clock signal CK4; a fourth shift register S4 of the (4m−2)th stage is configured to receive the signal C42 in the fourth clock signal CK4; a fourth shift register S4 of the (4m−1)th stage is configured to receive the signal C43 in the fourth clock signal CK4; a fourth shift register S4 of the 4mth stage is configured to receive the signal C44 in the fourth clock signal CK4, where m is an integer greater than 0, m≤N/8.

It should be noted that, the embodiments of the present disclosure include, but are not limited to, the case shown in FIG. 3. The first clock generator 130 may also be configured to provide the first clock signal CK1 to the first shift registers S1 through two clock signal lines; the second clock generator 140 may also be configured to provide the second clock signal CK2 to the second shift registers S2 through two clock signal lines; the first clock generator 130 may also be configured to provide the third clock signal CK3 to the third shift registers S3 through two clock signal lines; and the second clock generator 140 may also be configured to provide the fourth clock signal CK4 to the fourth shift registers S4 through two clock signal lines. Similar description will not be repeated here.

For example, as shown in FIG. 3, the array substrate 10 provided by embodiments of the present disclosure further comprises a clock controller 150. The clock controller 150 is respectively connected with the first clock generator 130 and the second clock generator 140. The clock controller 150 is configured to control the time sequence of the first clock signal CK1 and the time sequence of the third clock signal CK3 provided by the first clock generator 130, and to control the time sequence of the second clock signal CK2 and the time sequence of the fourth clock signal CK4 provided by the second clock generator 140.

For example, the clock controller 150 may further be configured to control the time sequences of the first trigger signal STV1, the first reset signal RST1, the second trigger signal STV2, the second reset signal RST2, the third trigger signal STV3, the third reset signal RST3, the fourth trigger signal STV4 and the fourth reset signal RST4 that are respectively or jointly provided by the first clock generator 130 and the second clock generator 140.

For example, the first clock generator 130, the second clock generator 140 and the clock controller 150 may be respectively implemented by a dedicated integrated circuit chip, or may be implemented by a circuit or by software, hardware (circuit), firmware, or any combination thereof. For example, the first clock generator 130 and the second clock generator 140 may be implemented by a same integrated chip. For another example, the clock controller 150 may be implemented by integrating into the first clock generator 130 or the second clock generator 140.

For another example, the first clock generator 130, the second clock generator 140 or the clock controller 150 may include a processor and a memory. In the embodiments of the present disclosure, the processor may process a data signal and may include various computing structures, for example, a complex instruction set computer (CISC) structure, a reduced instruction set computer (RISC) structure, or a structure implementing a combination of multiple instruction sets. In some embodiments, the processor may also be a microprocessor, for example, an X86 processor or an ARM processor, or may be a digital signal processor (DSP), and the like. The processor may control other components to execute a desired function. In the embodiments of the present disclosure, the memory may preserve instructions and/or data executed by the processor. For example, the memory may include one or more computer program products, and the computer program product may include various forms of computer-readable storage media, for example, volatile memory and/or non-volatile memory. The volatile memory may include, for example, random access memory (RAM) and/or cache, and the like. The non-volatile memory may include, for example, a read-only memory (ROM), a hard disk, a flash memory, and the like. One or more computer program instructions may be stored on the computer-readable storage medium, and the processor may execute the program instructions, to implement the desired functions (implemented by the processor) in the embodiments of the present disclosure. Various application programs and various data, for example, various data used and/or generated by the application programs, may also be stored in the computer-readable storage medium.

Figure 4:
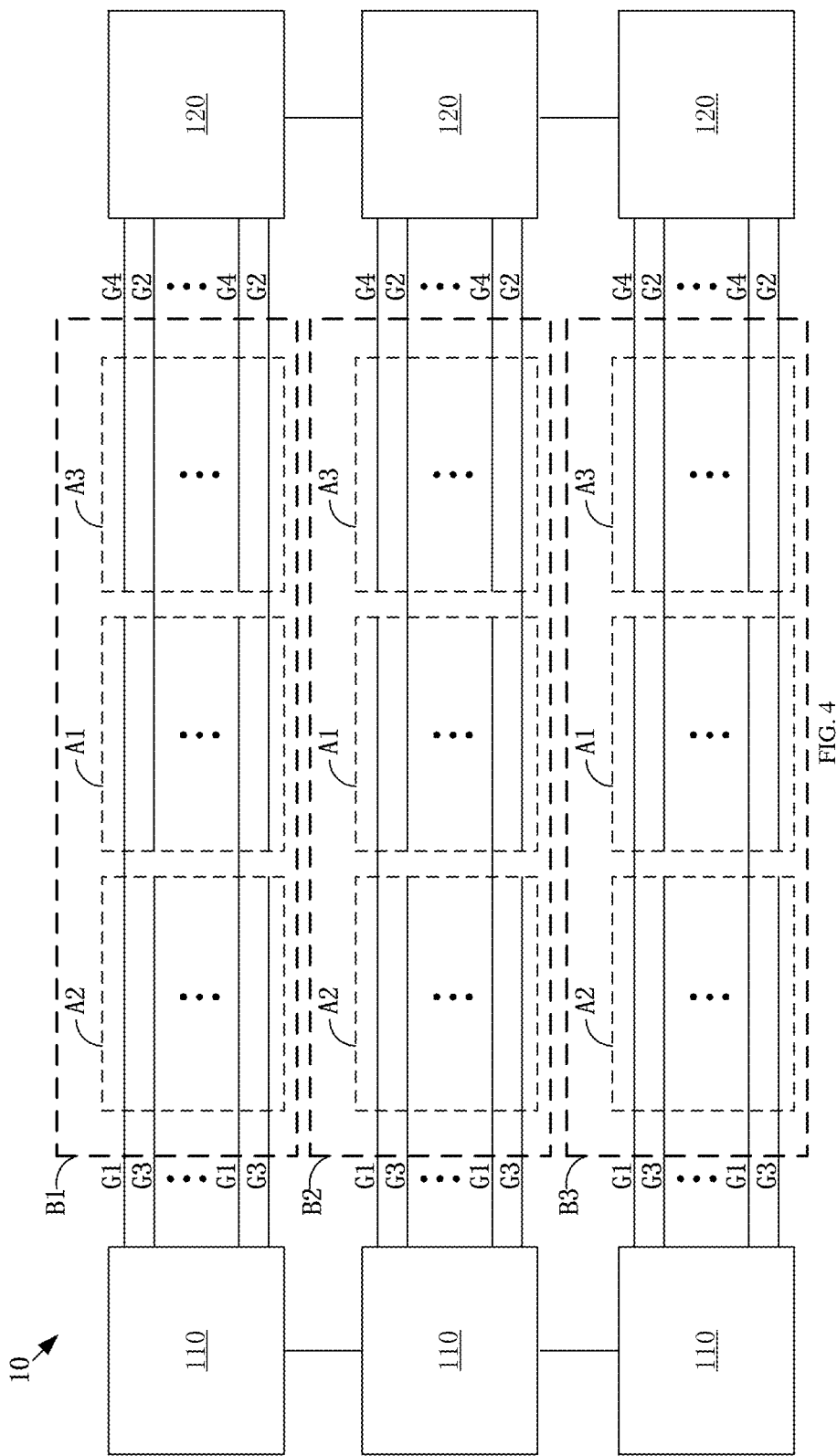
FIG. 4 is a fourth schematic diagram of an array substrate provided by an embodiment of the present disclosure.

For example, as shown in FIG. 4, the array substrate 10 provided by embodiments of the present disclosure comprises three display bands B1, B2 and B3 (for example, three display bands arranged from top to bottom). Each display band includes a first region A1, a second region A2 and a third region A3. For a same display band, the number of rows of first pixel units P1 in the first region A1, the number of rows of second pixel units P2 in the second region A2, and the number of rows of third pixel units P3 in the third region A3 are equal.

It should be noted that, the embodiments of the present disclosure include, but are not limited to, the case where the array substrate comprises three display bands. The array substrate may also include another number of (for example, 4, 5 or more) display bands.

For example, as shown in FIG. 4, three first gate driving circuits 110 correspondingly connected with three display bands B1, B2 and B3 respectively may be connected together so as to work cooperatively; three second gate driving circuits 120 correspondingly connected with the three display bands B1, B2 and B3 respectively may be connected together so as to work cooperatively. For example, the output terminal of the first shift register of the last stage in the first gate driving circuit correspondingly connected with the display band B1 may be connected with the input terminal of the first shift register of the first stage in the first gate driving circuit correspondingly connected with the display band B2, so that a signal output by the output terminal of the first shift register of the last stage in the first gate driving circuit correspondingly connected with the display band B1 is taken as the first trigger signal STV1 of the first shift register of the first stage in the first gate driving circuit correspondingly connected with the display band B2. For another example, the reset terminal of the first shift register of the last stage in the first gate driving circuit correspondingly connected with the display band B1 may be connected with the output terminal of the first shift register of the first stage in the first gate driving circuit correspondingly connected with the display band B2, so that a signal output by the output terminal of the first shift register of the first stage in the first gate driving circuit correspondingly connected with the display band B2 is taken as the first reset signal RST1 of the first shift register of the last stage in the first gate driving circuit correspondingly connected with the display band B1. Similarly, other shift registers in the first gate driving circuit or the second gate driving circuit correspondingly connected with different display bands may also have similar connection relationship, which will not be repeated here.

Figure 5:
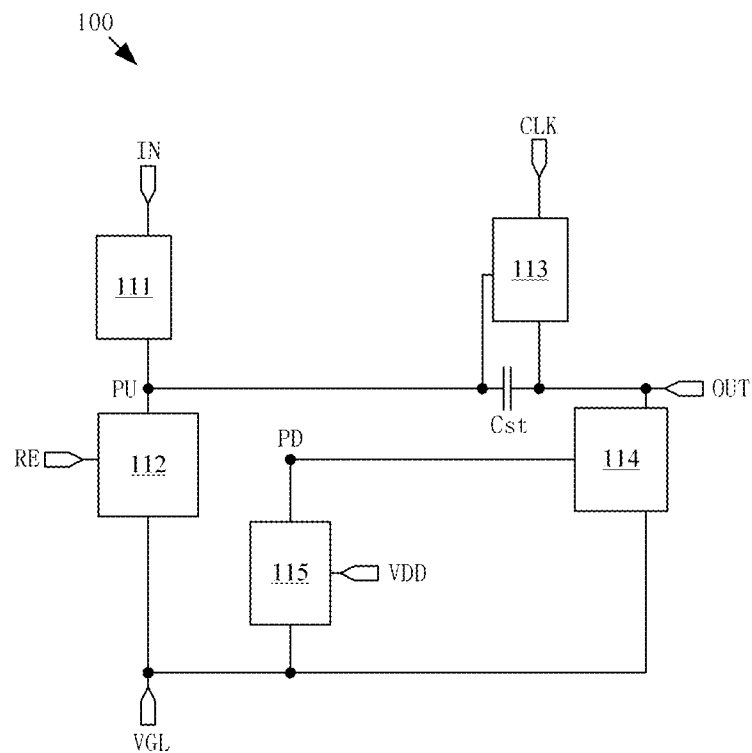
FIG. 5 is a first schematic diagram of a shift register in an array substrate provided by an embodiment of the present disclosure.

For example, as shown in FIG. 5, in the array substrate 10 provided by embodiments of the present disclosure, the first shift register S1, the second shift register S2, the third shift register S3 and the fourth shift register S4 may be implemented by a shift register 100 shown in FIG. 5. For example, each of the first shift register S1, the second shift register S2, the third shift register S3 and the fourth shift register S4 includes: an input circuit 111, a reset circuit 112, an output circuit 113, an output terminal pull-down circuit 114, a pull-down node control circuit 115 and a storage capacitor Cst. The input circuit 111 is respectively connected with the input terminal IN and a pull-up node PU; the reset circuit 112 is respectively connected with the pull-up node PU, the reset terminal RE, and a first power supply terminal VGL; the output circuit 113 is respectively connected with the pull-up node PU, the clock signal terminal CLK and the output terminal OUT; the output terminal pull-down circuit 114 is respectively connected with the output terminal OUT, a pull-down node PD and the first power supply terminal VGL; the pull-down node control circuit 115 is respectively connected with the pull-down node PD, a second power supply terminal VDD, and the first power supply terminal VGL; and the storage capacitor Cst is respectively connected with the pull-up node PU and the output terminal OUT.

For example, a first power supply voltage provided by the first power supply terminal VGL is a low level voltage (e.g., −5V, −1V, 0V or other values); a second power supply voltage provided by the second power supply terminal VDD is a high level voltage (for example, 5V, 8V or other values).

Figure 6:
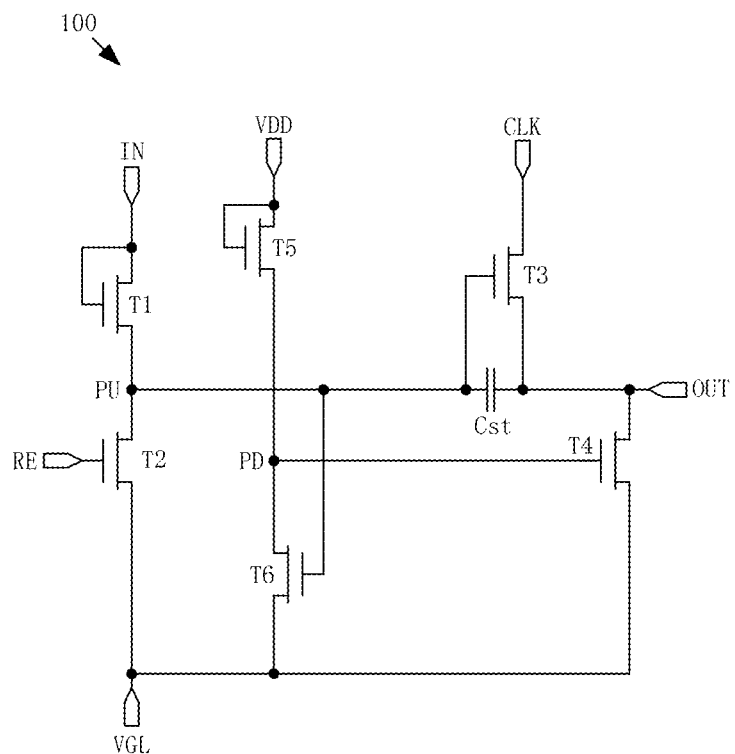
FIG. 6 is a second schematic diagram of a shift register in an array substrate provided by an embodiment of the present disclosure.

For example, with reference to FIG. 5 and FIG. 6, in the array substrate 10 provided by embodiments of the present disclosure, the input circuit 111 includes a first transistor T1, a first electrode of the first transistor T1 is connected with the input terminal IN, a gate electrode of the first transistor T1 is connected with the input terminal IN, and a second electrode of the first transistor T1 is connected with the pull-up node PU. The reset circuit 112 includes a second transistor T2, a first electrode of the second transistor T2 is connected with the pull-up node PU, a gate electrode of the second transistor T2 is connected with the reset terminal RE, and a second electrode of the second transistor T2 is connected with the first power supply terminal VGL. The output circuit 113 includes a third transistor T3, a first electrode of the third transistor T3 is connected with the clock signal terminal CLK, a gate electrode of the third transistor T3 is connected with the pull-up node PU, and a second electrode of the third transistor T3 is connected with the output terminal OUT. The output terminal pull-down circuit 114 includes a fourth transistor T4, a first electrode of the fourth transistor T4 is connected with the output terminal OUT, a gate electrode of the fourth transistor T4 is connected with the pull-down node PD, and a second electrode of the fourth transistor T4 is connected with the first power supply terminal VGL. The pull-down node control circuit 115 includes a fifth transistor T5 and a sixth transistor T6. A first electrode of the fifth transistor T5 is connected with the second power supply terminal VDD, a gate electrode of the fifth transistor T5 is connected with the second power supply terminal VDD, and a second electrode of the fifth transistor T5 is connected with the pull-down node PD; a first electrode of the sixth transistor T6 is connected with the pull-down node PD, a gate electrode of the sixth transistor T6 is connected with the pull-up node PU, and a second electrode of the sixth transistor T6 is connected with the first power supply terminal VGL. A first terminal of the storage capacitor Cst is connected with the pull-up node PU, and a second terminal of the storage capacitor Cst is connected with the output terminal OUT.

It should be noted that, the transistors used in the embodiments of the present disclosure may all be thin film transistors or field effect transistors or other switching devices with a same characteristic. A source electrode and a drain electrode of the transistor used here may be symmetrical in structure, such that the source electrode and the drain electrode thereof may not be structurally different. In the embodiments of the present disclosure, in order to distinguish between two electrodes besides the gate electrode of the transistor, one of the electrodes is directly described as the first electrode, and the other electrode as the second electrode; therefore, the first electrodes and the second electrodes of all or part of the transistors in the embodiments of the present disclosure are interchangeable according to needs. For example, a first electrode of a transistor according to the embodiments of the present disclosure may be a source electrode, and a second electrode may be a drain electrode; or, the first electrode of the transistor is a drain electrode, and the second electrode is a source electrode. In addition, a transistor may be classified into an N-type transistor or a P-type transistor according to the characteristic of the transistor. When the transistor is a P-type transistor, a turn-on voltage is a low level voltage (for example, 0V, −5V, or another value), and a turn-off voltage is a high level voltage (for example, 5V, 10V, or another values); when the transistor is an N-type transistor, a turn-on voltage is a high level voltage (for example, 5V, 10V, or another value), and a turn-off voltage is a low level voltage (for example, 0V, −5V, or another values). In the embodiments of the present disclosure, it is illustrated with a case where the first transistor T1, the second transistor T2, the third transistor T3, the fourth transistor T4, the fifth transistor T5, and the sixth transistor T6 are all N-type transistors. Based on description and teaching of the implementations in the present disclosure, those skilled in the art can easily conceive of implementations of using P-type transistors or a combination of N-type transistors and P-type transistors without additional inventive work. Therefore, these implementations also fall into the scope of the present disclosure.

It should be noted that, the shift register provided by embodiments of the present disclosure includes, but is not limited to, the case shown in FIG. 6; and according to actual needs, the shift register may further include other circuits, for example, a circuit having a noise reduction function.

Figure 7:
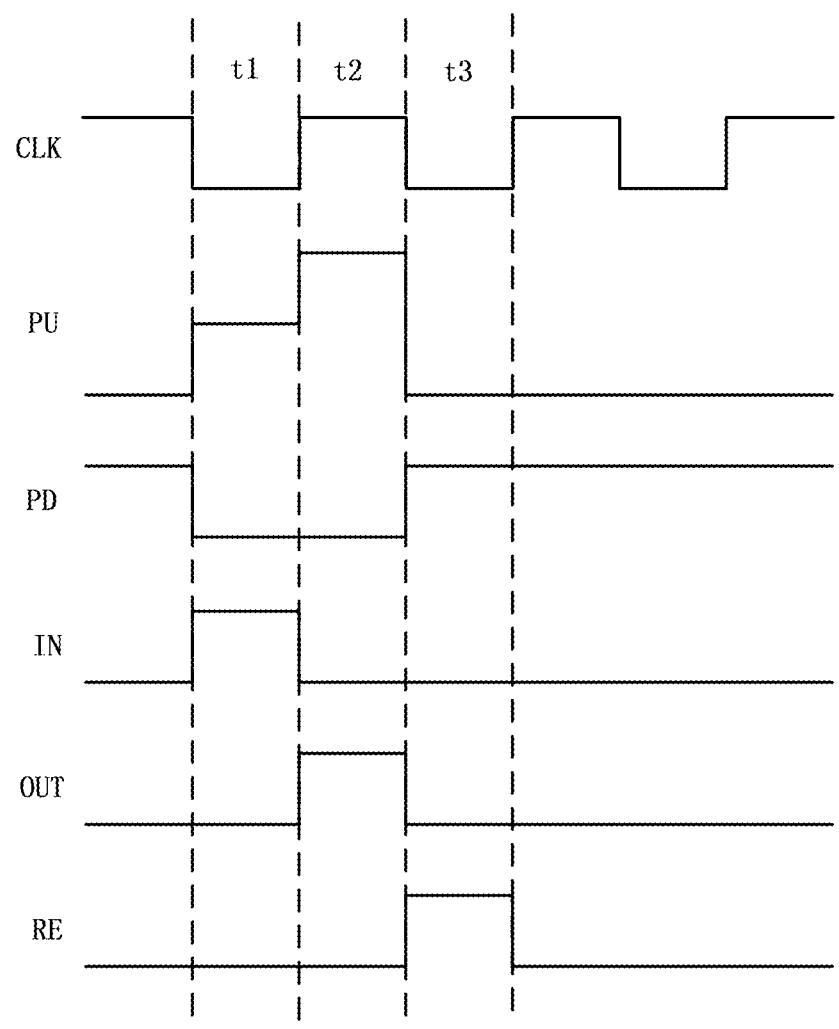
FIG. 7 is a driving sequence chart of the shift register shown in FIG. 6 provided by an embodiment of the present disclosure.

For example, a working principle of the shift register shown in FIG. 6 will be described next, with reference to FIG. 6 and FIG. 7.

In a first period t1, the input terminal IN receives a high level input signal, the first transistor T1 inputs the high level signal to the pull-up node PU, the third transistor T3 is turned on, the sixth transistor T6 is turned on, the sixth transistor T6 inputs the low level voltage of the first power supply terminal VGL to the pull-down node PD, and the second transistor T2 and the fourth transistor T4 are turned off.

In a second period t2, the clock signal terminal CLK receives a high level clock signal, the third transistor T3 transmits the high level signal to the output terminal OUT; a voltage of the pull-up node PU is further pulled up due to a bootstrap action of the storage capacitor Cst, so that the third transistor T3 is turned on more sufficiently, and the high level clock signal is output to the output terminal OUT through the third transistor T3.

In a third period t3, the reset terminal RE receives a high level signal, the second transistor T2 is turned on, the second transistor T2 transmits the first power supply voltage having a low level provided by the first power supply terminal VGL to the pull-up node PU, the sixth transistor T6 is turned off, the fifth transistor T5 transmits the second power supply voltage having a high level provided by the second power supply terminal VDD to the pull-down node PD, the fourth transistor T4 is turned on, and the fourth transistor T4 transmits the first power supply voltage having the low level provided by the first power supply terminal VGL to the output terminal OUT.

For example, it can be seen from the above-described working procedure that, in the second period t2, the output terminal OUT may output the high level signal synchronously or substantially synchronously with the high level clock signal received by the clock signal terminal CLK.

For example, in the array substrate 10, respective gate driving signals output by the first gate driving circuit 110 and the second gate driving circuit 120 may be adjusted by adjusting the clock signals (e.g., the first clock signal CK1, the second clock signal CK2, the third clock signal CK3 and the fourth clock signal CK4), so as to further implement change of the display resolution and perform selective driving with different resolutions in different regions of the array substrate. For example, this setting approach may save power.

Figure 8A:
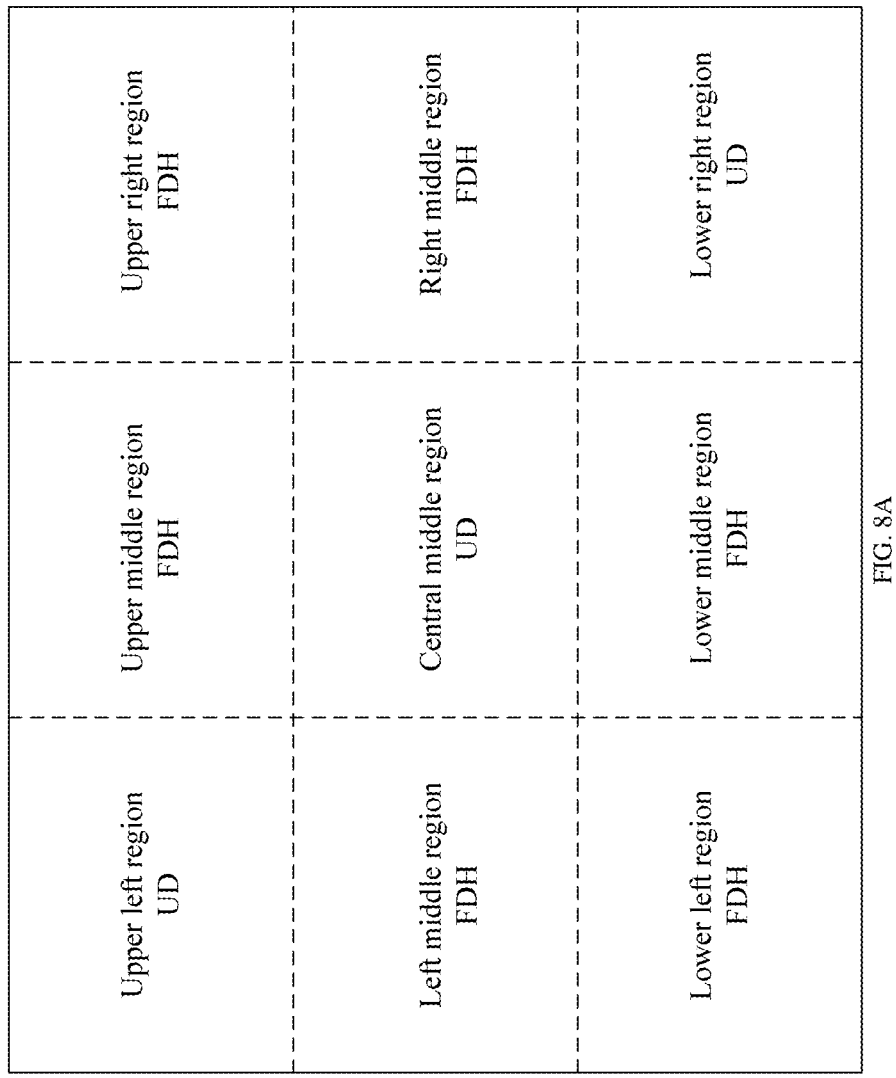
FIG. 8A is a first schematic diagram when an array substrate displays with different resolutions in different regions provided by an embodiment of the present disclosure.
Figure 8B:
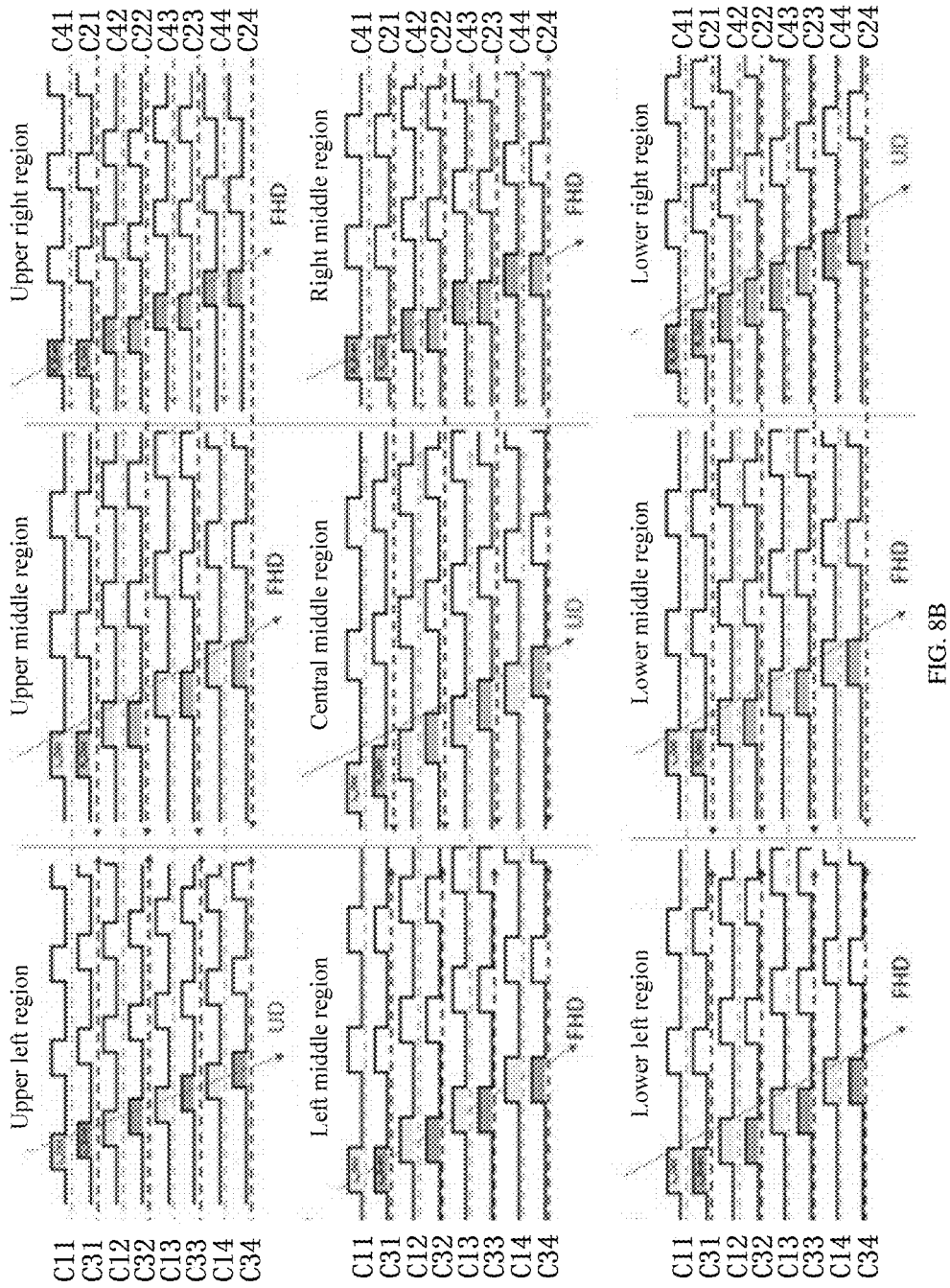
FIG. 8B is a driving sequence chart when the array substrate displays with different resolutions in different regions shown in FIG. 8A provided by an embodiment of the present disclosure.

For example, FIG. 8A is a first schematic diagram when the array substrate provided by embodiments of the present disclosure displays with different resolutions in different regions; and FIG. 8B is a driving sequence chart when the array substrate provided by embodiments of the present disclosure displays with different resolutions in different regions shown in FIG. 8A.

For example, with reference to FIG. 8A and FIG. 8B, the three display bands respectively include three regions, that is, the array substrate is divided into nine regions selective for changing resolutions. For example, an upper left region, a central middle region, and a lower right region are in the high resolution mode UD (4K pixels), and the other regions are in the low resolution mode FHD (2K pixels). In this case, in the first display band located on top, the time sequence of the first clock signal CK1, the time sequence of the second clock signal CK2 and the time sequence of the fourth clock signal CK4 corresponding thereto are the same, and they are different from the time sequence of the third clock signal CK3. That is, the time sequence of the signal C11, the time sequence of the signal C21 and the time sequence of the signal C41 are the same, and they are different from the time sequence of the signal C31; the time sequence of the signal C12, the time sequence of the signal C22 and the time sequence of the signal C42 are the same, and they are different from the time sequence of the signal C32; the time sequence of the signal C13, the time sequence of the signal C23 and the time sequence of the signal C43 are the same, and they are different from the time sequence of the signal C33; and the time sequence of the signal C14, the time sequence of the signal C24, and the time sequence of the signal C44 are the same, and they are different from the time sequence of the signal C34. In this way, it is able to achieve that the upper left region is in the high resolution mode (UD), and the upper middle region and the upper right region are in the low resolution mode (FHD). For example, in the second display band located in the middle, the time sequence of the first clock signal CK1 corresponding thereto is the same as the time sequence of the third clock signal CK3, the time sequence of the second clock signal CK2 is the same as the time sequence of the fourth clock signal CK4, and the time sequence of the first clock signal CK1 is different from the time sequence of the second clock signal CK2; and in this way, it is able to achieve that the central middle region is in the high resolution mode (UD), and the left middle region and the right middle region are in the low resolution mode (FHD). For example, in the third display band located at the bottom, the time sequence of the first clock signal CK1, the time sequence of the second clock signal CK2 and the time sequence of the third clock signal CK3 corresponding thereto are the same, and they are different from the time sequence of the fourth clock signal CK4; and in this way, it is able to achieve that the lower right region is in the high resolution mode UD, and the lower left region and the lower middle region are in the low resolution mode FHD.

Figure 9A:
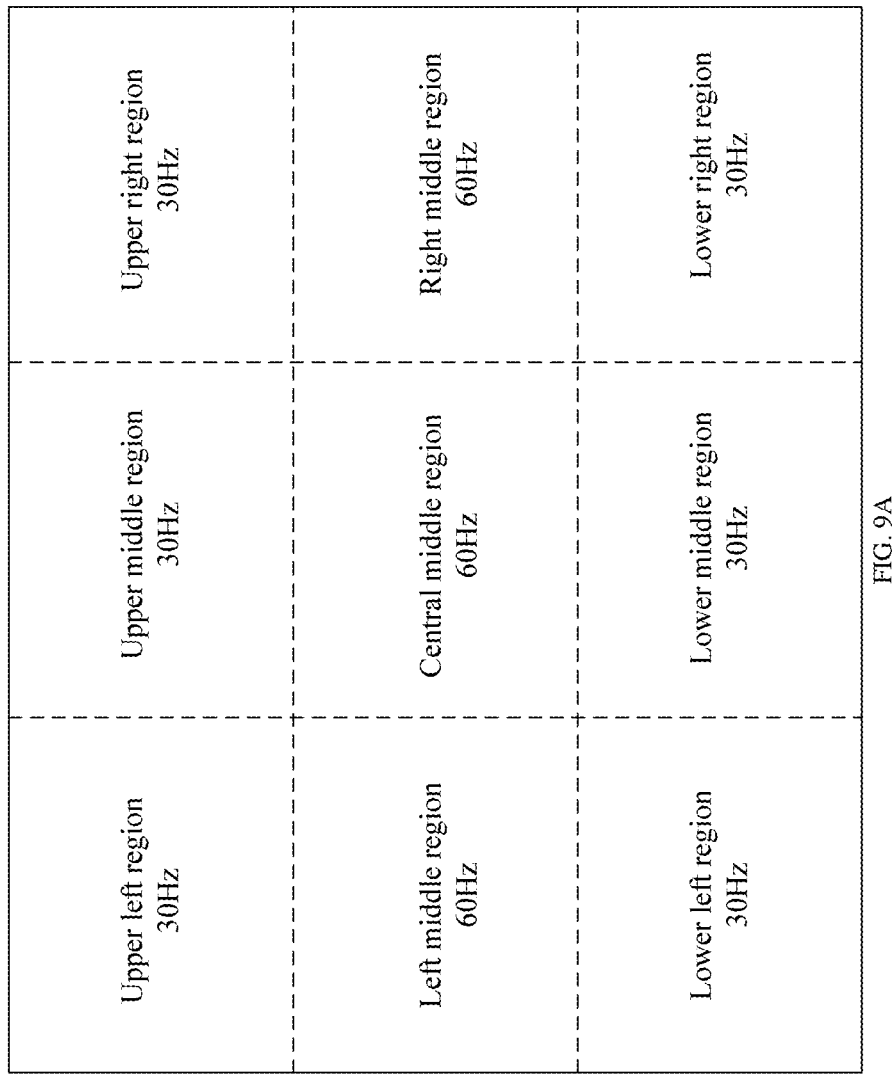
FIG. 9A is a second schematic diagram when an array substrate displays with different resolutions in different regions provided by an embodiment of the present disclosure.
Figure 9B:
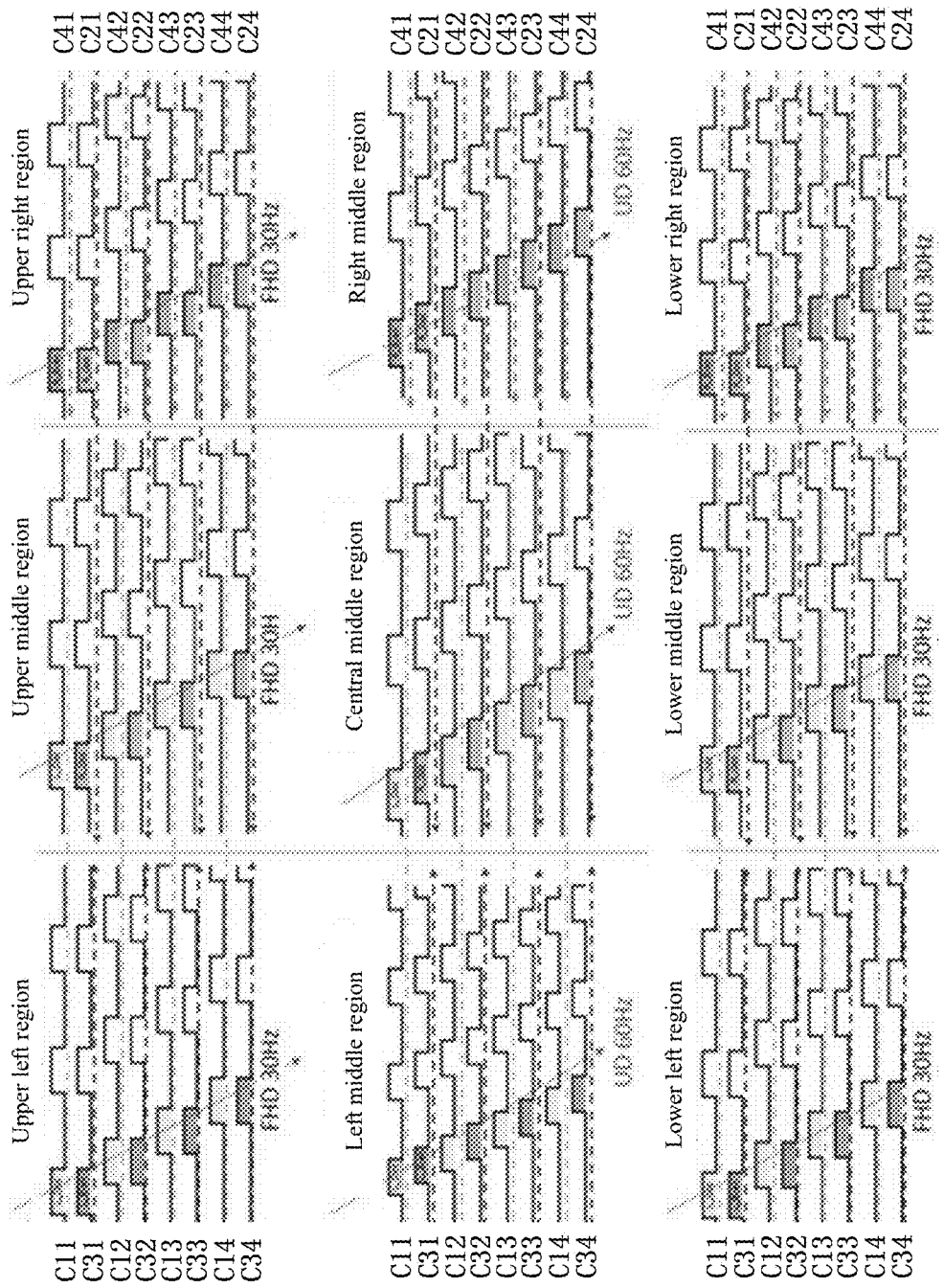
FIG. 9B is a driving sequence chart when the array substrate displays with different resolutions in different regions shown in FIG. 9A provided by an embodiment of the present disclosure.

For example, FIG. 9A is a second schematic diagram when the array substrate provided by embodiments of the present disclosure displays with different resolutions in different regions; and FIG. 9B is a driving sequence chart when the array substrate provided by embodiments of the present disclosure displays with different resolutions in different regions shown in FIG. 9A.

For example, with reference to FIG. 9A and FIG. 9B, the three display bands respectively include three regions, i.e., the array substrate is divided into nine regions selective for changing resolutions, so that changes of frame frequencies of nine regions may be implemented. For example, frame frequencies in the left middle region, the central middle region and the right middle region are 60 Hz, and frame frequencies in other regions are 30 Hz. In this case, in the first display band located on top, the time sequence of the first clock signal CK1, the time sequence of the second clock signal CK2, the time sequence of the third clock signal CK3 and the time sequence of the fourth clock signal CK4 corresponding thereto are all the same. For example, in the second display band located in the middle, the time sequence of the first clock signal CK1 corresponding thereto is different from the time sequence of the third clock signal CK3, and the time sequence of the second clock signal CK2 is different from the time sequence of the fourth clock signal CK4. For example, in the third display band located below, the time sequence of the first clock signal CK1, the time sequence of the second clock signal CK2, the time sequence of the third clock signal CK3 and the time sequence of the fourth clock signal CK4 corresponding thereto are all the same.

It should be noted that, display modes of the array substrate 10 include, but are not limited to, the cases shown in FIG. 8A, FIG. 8B, FIG. 9A and FIG. 9B; and by adjusting the time sequences of respective clock signals, more cases of selective driving of the resolution may be implemented, which will not be repeated here.

Figure 10:
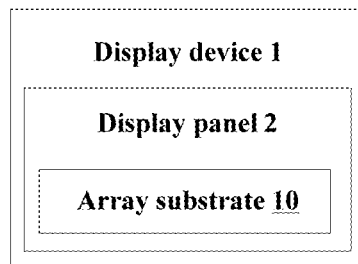
FIG. 10 is a schematic diagram of a display device provided by an embodiment of the present disclosure.
Figure 11:
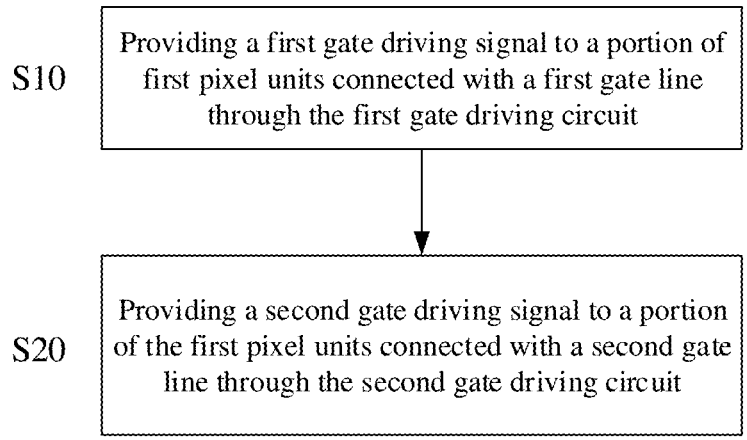
FIG. 11 is a flow chart of a driving method of an array substrate provided by an embodiment of the present disclosure.

An embodiment of the present disclosure further provides a display panel 2, and as shown in FIG. 10, the display panel 2 comprises the array substrate 10 provided by any one of the embodiments of the present disclosure.

For example, the display panel 2 provided by embodiments of the present disclosure may be a gate on array (GOA) display panel.

An embodiment of the present disclosure further provides a display device 1, and as shown in FIG. 10, the display device 1 comprises the display panel 2 provided by any one of the embodiments of the present disclosure.

For example, the display device 1 may be an E-paper, a mobile phone, a tablet personal computer, a television, a monitor, a laptop, a digital photo frame, a navigator, and any other product or component having a display function.

For example, in at least one embodiment of the present disclosure, the display device 1 may further comprise a signal receiving circuit, a video signal decoding circuit, and the like, so that a video signal may be received and processed; or may further comprise a modulation and demodulation circuit or an antenna and the like according to needs, so as to be in signal connection with other devices via a network, a wireless signal, and the like.

An embodiment of the present disclosure further provides a method for driving the array substrate 10 provided by any one of the embodiments of the present disclosure, comprising steps of:

Step S10: providing a first gate driving signal to a first portion of first pixel units P1 through a first gate driving circuit 110; and Step S20: providing a second gate driving signal to a second portion of the first pixel units P1 through a second gate driving circuit 120.

For example, when a first region is in a high resolution mode, a time sequence of the first gate driving signal is different from a time sequence of the second gate driving signal; when the first region is in a low resolution mode, the time sequence of the first gate driving signal is the same as the time sequence of the second gate driving signal.

For example, in the driving method, the first gate driving signal and the second gate driving signal output by the first gate driving circuit 110 and the second gate driving circuit 120 respectively may be adjusted by adjusting clock signals (e.g., a first clock signal CK1 and a second clock signal CK2), so as to implement change of display resolutions and perform selective driving with different resolutions in different regions of the array substrate.

For example, when the array substrate further comprises a second region and a third region, respective gate driving signals output by the first gate driving circuit 110 and the second gate driving circuit 120 may be adjusted by adjusting clock signals (e.g., the first clock signal CK1, the second clock signal CK2, a third clock signal CK3 and a fourth clock signal CK4), so as to implement change of display resolutions and perform selective driving with different resolutions in different regions of the array substrate.

Although the present disclosure has been described in detail with general description and specific implementing modes, it is obvious to those skilled in the art that some modifications or improvements may be made on the basis of the embodiments of the present disclosure. Therefore, these modifications and improvements made without departing from the spirit of the present disclosure all fall within the protection scope of the present disclosure.

The present application claims the priority of the Chinese Patent Application No. 201710289041.0 filed on Apr. 27, 2017, which is incorporated herein by reference in its entirety as part of the disclosure of the present application.

The invention claimed is:

1. An array substrate, comprising:
   a plurality of first pixel units arranged in an array in a first region;
   a first gate driving circuit;
   a second gate driving circuit;
   a plurality of first gate lines connected with the first gate driving circuit;
   a plurality of second gate lines connected with the second gate driving circuit,
   a plurality of second pixel units arranged in an array in a second region;
   a plurality of third pixel units arranged in an array in a third region;
   a plurality of third gate lines connected with the first gate driving circuit; and
   a plurality of fourth gate lines connected with the second gate driving circuit, wherein:
   a first portion of the plurality of first pixel units is connected with the plurality of first gate lines, and each first pixel unit in the first portion of the plurality of first pixel units is connected with one of the plurality of first state lines;
   a second portion of the plurality of first pixel units is connected with the plurality of second gate lines, and each first pixel unit in the second portion of the plurality of first pixel units is connected with one of the plurality of second gate lines;

a first portion of the plurality of second pixel units is connected with the plurality of first gate lines, and each second pixel unit in the first portion of the plurality of second pixel units is connected with one of the plurality of first gate lines;

a second portion of the plurality of second pixel units is connected with the plurality of third gate lines, and each second pixel unit in the second portion of the plurality of second pixel units is connected with one of the plurality of third gate lines;

a first portion of the plurality of third pixel units is connected with the plurality of second gate lines, and each third pixel unit in the first portion of the plurality of third pixel units is connected with one of the plurality of second gate lines;

a second portion of the plurality of third pixel units is connected with the plurality of fourth gate lines, and each third pixel unit in the second portion of the plurality of third pixel units is connected with one of the plurality of fourth gate lines;

wherein first pixel units in a (2n−1)th row and second pixel units in the (2n−1)th row are connected with an nth first gate line;

first pixel units in a 2nth row and third pixel units in the 2nth row are connected with an nth second gate line;

second pixel units in the 2nth row are connected with an nth third gate line;

third pixel units in the (2n−1)th row are connected with an nth fourth gate line; and n is an integer greater than 0, n≤N/2, and N is a total number of rows of pixel units in respective regions.

2. The array substrate according to claim 1, wherein the first region is provided between the second region and the third region.

3. The array substrate according to claim 1, wherein the first gate driving circuit and the second gate driving circuit are provided on opposite sides of the array substrate.

4. The array substrate according to claim 1, wherein:

the first gate driving circuit includes a first shift register group, and the first shift register group includes a plurality of cascaded first shift registers; except for a first stage and a last stage, an input terminal of a first shift register of a present stage is connected with an output terminal of a first shift register of a previous stage;

the second gate driving circuit includes a second shift register group, and the second shift register group includes a plurality of cascaded second shift registers; except for a first stage and a last stage, an input terminal of a second shift register of a present stage is connected with an output terminal of a second shift register of a previous stage;

the first gate driving circuit further includes a third shift register group, and the third shift register group includes a plurality of cascaded third shift registers; except for a first stage and a last stage, an input terminal of a third shift register of a present stage is connected with an output terminal of a third shift register of a previous stage; and the second gate driving circuit further includes a fourth shift register group, and the fourth shift register group includes a plurality of cascaded first shift registers; except for a first stage and a last stage, an input terminal of a fourth shift register of a present stage is connected with an output terminal of a fourth shift register of a previous stage.

5. The array substrate according to claim 4, wherein:

an output terminal of each respective first shift register is correspondingly connected with one of the first gate lines, and the respective first shift register is configured to output a first gate driving signal to the one of the first gate lines in response to a first clock signal;

an output terminal of each respective second shift register is correspondingly connected with one of the second gate lines, and the respective second shift register is configured to output a second gate driving signal to the one of the second gate lines in response to a second clock signal;

an output terminal of each respective third shift register is correspondingly connected with one of the third gate lines, and the respective third shift register is configured to output a third gate driving signal to the one of the third gate lines in response to a third clock signal; and an output terminal of each respective fourth shift register is correspondingly connected with one of the fourth gate line, and the respective fourth shift register is configured to output a fourth gate driving signal to the one of the fourth gate lines in response to a fourth clock signal.

6. The array substrate according to claim 5, further comprising a first clock generator and a second clock generator, wherein:

the first clock generator is configured to provide the first clock signal to the first shift registers;

the second clock generator is configured to provide the second clock signal to the second shift registers;

the first clock generator is further configured to provide the third clock signal to the third shift registers; and the second clock generator is further configured to provide the fourth clock signal to the fourth shift registers.

7. The array substrate according to claim 6, further comprising:

a clock controller, respectively connected with the first clock generator and the second clock generator, configured to control a time sequence of the first clock signal and a time sequence of the third clock signal provided by the first clock generator, and to control a time sequence of the second clock signal and a time sequence of the fourth clock signal provided by the second clock generator.

8. The array substrate according to claim 1, comprising three display bands, wherein each of the display bands includes the first region, the second region and the third region, and in each same display band, a quantity of rows of first pixel units in the first region, a quantity of rows of second pixel units in the second region, and a quantity of rows of third pixel units in the third region are equal.

9. The array substrate according to claim 5, wherein each of the first shift register, the second shift register, the third shift register and the fourth shift register includes:

an input circuit, respectively connected with an input terminal and a pull-up node;

a reset circuit, respectively connected with the pull-up node, a reset terminal, and a first power supply terminal;

an output circuit, respectively connected with the pull-up node, a clock signal terminal and an output terminal;

an output terminal pull-down circuit, respectively connected with the output terminal, a pull-down node and the first power supply terminal;
a pull-down node control circuit, respectively connected with the pull-down node, a second power supply terminal, and the first power supply terminal; and
a storage capacitor, respectively connected with the pull-up node and the output terminal.

10. The array substrate according to claim 9, wherein:
the input circuit includes a first transistor, a first electrode of the first transistor is connected with the input terminal, a gate electrode of the first transistor is connected with the input terminal, and a second electrode of the first transistor is connected with the pull-up node;
the reset circuit includes a second transistor, a first electrode of the second transistor is connected with the pull-up node, a gate electrode of the second transistor is connected with the reset terminal, and a second electrode of the second transistor is connected with the first power supply terminal;
the output circuit includes a third transistor, a first electrode of the third transistor is connected with the clock signal terminal, a gate electrode of the third transistor is connected with the pull-up node, and a second electrode of the third transistor is connected with the output terminal;
the output terminal pull-down circuit includes a fourth transistor, a first electrode of the fourth transistor is connected with the output terminal, a gate electrode of the fourth transistor is connected with the pull-down node, and a second electrode of the fourth transistor is connected with the first power supply terminal;
the pull-down node control circuit includes a fifth transistor and a sixth transistor, a first electrode of the fifth transistor is connected with the second power supply terminal, a gate electrode of the fifth transistor is connected with the second power supply terminal, and a second electrode of the fifth transistor is connected with the pull-down node, a first electrode of the sixth transistor is connected with the pull-down node, a gate electrode of the sixth transistor is connected with the pull-up node, and a second electrode of the sixth transistor is connected with the first power supply terminal; and
a first terminal of the storage capacitor is connected with the pull-up node, and a second terminal of the storage capacitor is connected with the output terminal.

11. A display panel, comprising the array substrate according to claim 1.

12. A display device, comprising the display panel according to claim 11.

13. A method for driving the array substrate according to claim 1, comprising:
providing a first gate driving signal to a first portion of first pixel units through a first gate driving circuit; and
providing a second gate driving signal to a second portion of the first pixel units through a second gate driving circuit, wherein:
when a first region is in a high resolution mode, a time sequence of the first gate driving signal is different from a time sequence of the second gate driving signal; and
when the first region is in a low resolution mode, the time sequence of the first gate driving signal is the same as the time sequence of the second gate driving signal.

14. The array substrate according to claim 2, wherein:
the first gate driving circuit includes a first shift register group, and the first shift register group includes a plurality of cascaded first shift registers; except for a first stage and a last stage, an input terminal of a first shift register of a present stage is connected with an output terminal of a first shift register of a previous stage;
the second gate driving circuit includes a second shift register group, and the second shift register group includes a plurality of cascaded second shift registers; except for a first stage and a last stage, an input terminal of a second shift register of a present stage is connected with an output terminal of a second shift register of a previous stage;
the first gate driving circuit further includes a third shift register group, and the third shift register group includes a plurality of cascaded third shift registers; except for a first stage and a last stage, an input terminal of a third shift register of a present stage is connected with an output terminal of a third shift register of a previous stage; and
the second gate driving circuit further includes a fourth shift register group, and the fourth shift register group includes a plurality of cascaded first shift registers; except for a first stage and a last stage, an input terminal of a fourth shift register of a present stage is connected with an output terminal of a fourth shift register of a previous stage.

15. The array substrate according to claim 2, comprising three display bands, wherein each of the display bands includes the first region, the second region and the third region, and in each same display band, a quantity of rows of first pixel units in the first region, a quantity of rows of second pixel units in the second region, and a quantity of rows of third pixel units in the third region are equal.

* * * * *